United States Patent [19]

Frank

[11] Patent Number: 4,575,741

[45] Date of Patent: Mar. 11, 1986

[54] CRYOGENIC TRANSISTOR WITH A SUPERCONDUCTING BASE AND A SEMICONDUCTOR-ISOLATED COLLECTOR

[75] Inventor: David J. Frank, Ossining, N.Y.

[73] Assignee: International Business Machines Corporation, Armonk, N.Y.

[21] Appl. No.: 604,183

[22] Filed: Apr. 26, 1984

[51] Int. Cl.[4] .................... H01L 49/02; H01L 39/22; H01L 23/48

[52] U.S. Cl. .......................................... 357/6; 357/5; 357/65; 357/4

[58] Field of Search ............................ 357/5, 6, 4, 65

[56] References Cited

U.S. PATENT DOCUMENTS

| | | | |
|---|---|---|---|
| 3,155,886 | 11/1964 | Pankove | 317/235 |
| 3,178,594 | 4/1965 | Pollack | 307/88.5 |
| 3,204,115 | 8/1965 | Parmenter | 307/88.5 |
| 3,275,844 | 9/1966 | Simmons | 307/88.5 |
| 3,372,315 | 3/1968 | Hartman | 317/235 |
| 4,157,555 | 6/1970 | Gray | 357/6 |
| 4,220,959 | 9/1980 | Kroger | 357/5 |
| 4,334,158 | 6/1982 | Faris | 307/462 |

Primary Examiner—Martin H. Edlow
Assistant Examiner—Terri M. Henn
Attorney, Agent, or Firm—Thomas J. Kilgannon

[57] ABSTRACT

This invention relates generally to cryogenic amplifying-switching devices and more specifically relates to a cryogenic transistor with a superconducting base and a collector isolated from the base by a semiconductor element. Still more specifically, the invention is directed to a three terminal, transistor-like device which incorporates three metal layers. The first and second of the three layers are separated by an insulating tunnel barrier and the second and third layers are separated by a semiconductor layer of a thickness sufficient to inhibit tunnelling. The semiconductor layer has a barrier height (low) which is sufficient to permit the passage of quasi-particles from the second layer while simultaneously inhibiting the passage of Cooper pairs. The second layer is a superconductor while the first and third layers may be superconductors or normal metals. The second and third layers are connected to the semiconductor layer by means of ohmic contacts.

30 Claims, 3 Drawing Figures

CRYOGENIC TRANSISTOR WITH A SUPERCONDUCTING BASE AND A SEMICONDUCTOR-ISOLATED COLLECTOR

DESCRIPTION

Technical Field

This invention relates generally to cryogenic amplifying-switching devices and more specifically relates to a cryogenic transistor with a superconducting base and a collector isolated from the base by a semiconductor element. The latter, in addition to providing excellent input/output isolation, permits the flow of quasiparticles while simultaneously inhibiting the passage of Cooper pairs. Still more specifically, the invention is directed to a three terminal, transistor-like device which incorporates three metal layers. The first and second of the three layers are separated by an insulating tunnel barrier or any other barrier suitable for the injection of quasiparticles and the second and third layers are separated by a semiconductor layer of a thickness sufficient to inhibit tunnelling. The semiconductor layer has a barrier height (low) which is sufficient to permit the passage of quasiparticles from the second layer while simultaneously inhibiting the passage of Cooper pairs. The second layer is a superconductor while the first and third layers may be superconductors, normal metals or degenerate semiconductors. The second and third layers are connected to the semiconductor layer by means of ohmic contacts. In a preferred embodiment, the first layer or emitter is formed from aluminum while the second and third layers otherwise characterized as the base and collector, respectively, are made of tantalum. A barrier layer of tantalum oxide ($Ta_2O_5$) separates the first and second layers and is sufficiently thin to permit tunnelling between these layers. A layer of semiconductor such as p-type gallium antimonide (GaSb) or indium antimonide (InSb) is disposed between the second and third layers and has an energy barrier height sufficient to permit the passage of quasiparticles. While the semiconductor layer should have a thickness sufficient to inhibit the tunnelling of Cooper pairs, it should also be thin enough so that the effects of impact ionization are negligible. In the above described device, the ohmic contacts, which are necessary to achieve the desired current flow, are obtained by virtue of the fact that gallium antimonide and indium antimonide naturally form ohmic contacts with most metals, including tantalum. Finally, means for switching the flow of quasiparticles is connected to the resulting device.

BACKGROUND OF THE INVENTION

The prior art shows a number of three terminal, transistor-like devices formed from layered structures. Some require the use of metals operating in a superconducting mode while others require the use of normal metals or combinations of such metals. In addition, some of these structures call for the use of tunnel barriers, insulators or crystalline materials which separate the metals one from the other. To the extent that such prior art arrangements have not come into wide use, it is apparent that they are lacking in certain qualities which are present in known semiconductor transistor devices. Apart from this, while three terminal, cryogenic devices have appeared in the prior art, for reasons like poor gain and lack of isolation, none of these devices have filled the need for a transistor-like device operating in the cryogenic environment.

U.S. Pat. No. 3,155,886 filed Aug. 16, 1961 shows three superconductors separated by a pair of tunnel barriers. In this instance, the tunnel barrier between the second and third superconductor is a high band gap material.

U.S. Pat. No. 3,204,115 filed July 31, 1961 shows an arrangement similar to the '886 reference. One difference is that the first and third materials are normal metals.

U.S. Pat. No. 3,275,844 filed Nov. 16, 1962 discloses a transistor-like structure similar to the '886 reference except that all metals are normal metals.

U.S. Pat. No. 3,372,315 filed Aug. 4, 1965 shows a device similar to the '844 reference except that the second insulator is a single crystal material (mica) and has a "low" energy barrier height. This device was intended to run at room temperature. While the reference calls for a low barrier, in reality, the barrier height is rather high (0.8–0.95 eV) relative to that required (~0.005 eV) for the semiconductor of the present application. In addition, the reference has no requirement for a superconducting base.

U.S. Pat. No. 3,178,594 filed June 27, 1962 shows a transistor-like device wherein the middle metal film is required to be superconducting whereas the other two may be normal or superconducting. The insulators between films are, however, both high energy gap materials and of a thickness which permits tunnelling.

U.S. Pat. No. 4,157,555 filed Nov. 7, 1977 shows a superconducting transistor composed of three thin films of superconducting material separated from each other by insulating oxides of a thickness sufficient to permit tunnelling. One junction is biased above twice the superconducting energy gap and the other is biased at less than twice the superconducting energy gap. Injection of quasiparticles into the center film by one junction provides a current gain in the second junction. The semiconductor layer of the present application improves on this reference by blocking the return flow of quasiparticles thereby keeping the common base current gain equal to or less than one. Also, in the present application, there is no tunnelling between the base and collector regions. By providing a low energy barrier material, the transmission of quasiparticles is encouraged while the passage of Cooper pairs is inhibited.

U.S. Pat. No. 4,334,158 filed June 6, 1980 shows a three terminal device called a QUITERON in which the superconducting gap of a superconducting material is caused to vanish by the injection of excess quasiparticles. The device uses a pair of tunnel barriers and specifically shows that the tunnel barrier of the injector junction may be a semiconductor. It should be appreciated that in this reference, the semiconductor has no other function than its use as a tunnel barrier. To the extent that the device of this reference suffers from poor input/output isolation, the device of the present application, in addition to having gain, has excellent input/output isolation.

It is, therefore, an object of the present invention to provide a three terminal, transistor-like device which exhibits gain and has excellent input/output isolation.

Another object is to provide a three terminal, transistor-like device which exhibits good linearity and has low power dissipation.

Still another object is to provide a three terminal, transistor-like device which exhibits high speed switching at cryogenic temperatures. Yet another object is to provide a three terminal, transistor-like device which can be formed into high density integrated circuits.

BRIEF SUMMARY OF THE INVENTION

The present invention relates to a cryogenic transistor with a superconducting base and a semiconductor-isolated collector. The cryogenic transistor is basically a five layer device consisting of a layer of metal such as aluminum, a tunnel barrier comprising an insulator like tantalum oxide ($Ta_2O_5$), a layer of metal such as tantalum which must be superconducting, a layer of semiconductor material such as p-type gallium antimonide or indium antimonide which is thick enough to inhibit tunnelling and has an energy barrier height sufficient to permit the flow of quasiparticles while simultaneously inhibiting the passage of Cooper pairs and a final layer of metal like tantalum. Also included are the ohmic contacts which form between the tantalum layers and the semiconductor.

In another embodiment, the first three layers are the same as in the first embodiment but the semiconductor is p-type germanium and the last metal layer is aluminum. In both embodiments, the metal layers contacting the semiconductor material either form an ohmic contact naturally as is the case with tantalum and gallium antimonide or indium antimonide and aluminum and germanium or an ohmic contact is formed between tantalum and germanium by first diffusing aluminum into the surface of germanium to which a tantalum contact is to be made. By applying appropriate biases between the metal layers which can also be characterized as emitter, base and collector layers, quasiparticles which are injected into the superconducting base will pass to the collector terminal. The carriers which appear at the collector are prevented from returning to the superconducting base by the barrier height of the semiconductor material. The resulting device is capable of high speed switching and exhibits high gain and has excellent input/output isolation.

These and other objects, features and advantages will be more apparent from the following more particular description of the preferred embodiments.

DESCRIPTION OF THE PREFERRED EMBODIMENTS

As used in the following description, the term Cooper pairs shall refer to the paired electrons or holes in a superconductor below its critical temperature. The term quasiparticle shall refer to an unpaired electron or hole in a superconductor. It should be noted that quasiparticles exhibit a mixture of electron-like and hole-like properties. It should also be understood that when one, for simplicity, refers to quasiparticles passing through a semiconductor, a more complete physical description is that when a quasiparticle enters a semiconductor, it becomes definitely either a hole or an electron. It is this electron or hole which passes through the semiconductor.

Figure 1:
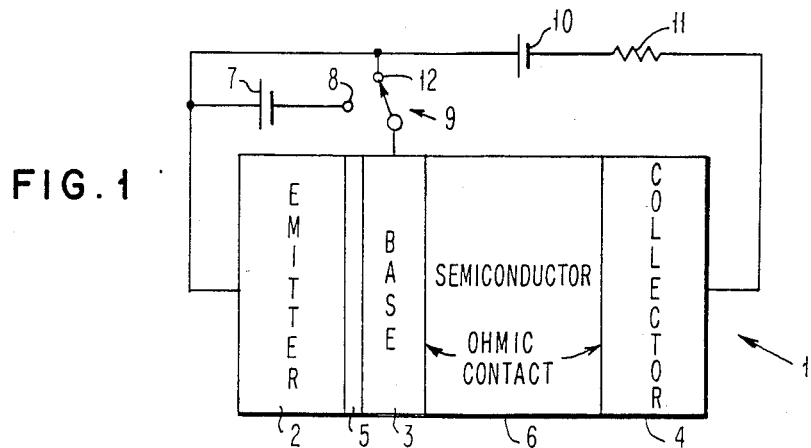
FIG. 1 is a cross-sectional view of a cryogenic, three terminal, transistor-like device which incorporates a low energy barrier semiconductor material and a superconducting base ohmically connected to said semiconductor material. Biasing means which switch the device are also shown.

Referring now to FIG. 1 there is shown a cryogenic, three terminal, transistor-like device 1 which includes metallic layers 2, 3, 4 which are otherwise characterized in FIG. 1 as emitter, base and collector, respectively. Layers 2, 3 are spaced from each other by a layer 5 of insulating material which is of a thickness sufficient to permit the tunnelling of charge carriers through it. A layer 6 of semiconductor material is disposed between layers 3, 4 which is doped such that under suitable bias conditions, it presents essentially no energy barrier to the passage of hole-like quasiparticles but successfully blocks the passage of electron-like quasiparticles and Cooper pairs. Layer 6 must have a thickness sufficient to inhibit the tunnelling of quasiparticles and Cooper pairs through it and yet be sufficiently thin that effects due to impact ionization are negligible. Impact ionization effects may also be decreased by the suitable choice of a doping profile in layer 6. Layers 3, 4 are connected to layer 6 by means of ohmic contacts which form naturally as a result of the materials being used or are formed using a material which is interposed between the metal of layer 3 and the semiconductor of layer 6. In the arrangement of FIG. 1, layer 3 otherwise characterized as a base must be superconducting while layers 2, 4 otherwise characterized as emitter, collector, respectively, may be superconducting, normal metals or degenerate semiconductors. To render device 1 conductive, a bias which makes emitter 2 positive with respect to base 3 is applied from bias source 7 between base 3 and emitter 2 via terminal 8 of double-pole switch 9. A second bias source 10 applies a bias between layer 2 and layer 4 via load device 11 which renders layer 4 or the collector negative relative to layer 3 or the base. The specific operating voltages which will be defined hereinafter in detail cause quasiparticles to be injected into layer 3 from layer 2. The quasiparticles have sufficient energy to pass over the low energy barrier provided by the semiconductor of layer 6 and flow as holes, in the example given, to layer 4 where they are collected. If switch 9 is connected to terminal 12 thereof instead of terminal 8, layers 2,3 are shorted and device 1 is rendered nonconductive.

To render the base superconducting, device 1 is submerged in liquid helium which provides a temperature of approximately 2° Kelvin ($\frac{1}{2}$ Tc=2° K. for Ta). Under such circumstances, semiconductor layer 6 experiences a phenomenon called carrier freeze-out and effectively acts as an insulator with respect to thermally generated charges. The primary reason for operating device 1 well below the transition temperature of the superconducting base is that this results in a very low thermal quasiparticle density in the superconducting base resulting in low leakage current between the collector and the base.

In a preferred embodiment, layer 1 may be made of aluminum while layers 3,4 may be made of tantalum. Layer 5 may be made of tantalum oxide ($Ta_2O_5$) and should have a thickness in the range of 10–100 Angstroms to permit quasiparticle tunnelling through it. Layer 6 of semiconductor may be a p-type semiconductor such as gallium or indium antimonide and may have a thickness in the range of 1,000–10,000 Angstroms. Thicknesses in this range prevent tunnelling and render negligible the effects of impact ionization. Semiconductor layer 6 is doped with a dopant such as carbon to a level of $10^{15}$–$10^{16} cm^{-3}$. Broadly speaking, the doping level should be such as to render the semiconductor not quite degenerate with the edge of its conduction or valence band approximately lined up with the upper or lower edge of the gap of the superconducting layer 3. Layer 3, otherwise characterized in FIG. 1 as the base, may have a thickness which is as thin as possible consistent with the formation of a continuous layer of tantalum. Thicknesses in the order of 100–300 Angstroms are suitable. Using the materials just described, the tantalum of layers 3, 4 when deposited on gallium or indium antimonide naturally forms an ohmic contact with the semiconductor material. The use of ohmic contacts allows electrons or holes to move freely from layer 3 to layer 4 at only millielectron volt (meV) energy levels. Layers 2, 4 may be of any reasonable thickness consistent with the overall device design.

In another embodiment, layers 2, 3 and 5 may be made of the same materials as the layers of the first embodiment discussed hereinabove. Layer 6, however, may be made of a p-type semiconductor such as germanium which is doped to near degeneracy with a dopant such as boron. Finally, layer 4 may be made of tantalum. To the extent that aluminum readily forms an ohmic contact with p-type germanium when annealed, no special processing is required. However, because tantalum does not directly form an ohmic contact with germanium, aluminum is first diffused at a temperature of 300° C. into the surface of the germanium to form a shallow degenerate Schottky contact. In a subsequent step, tantalum is deposited and an ohmic contact results.

Both of the above-described devices are layered structures and it is well within the skill of those versed in the semiconductor arts to form the structure of FIG. 1. Well-known techniques such as vacuum deposition, molecular beam epitaxy and chemical vapor deposition may be used. In a simple approach, a wafer of gallium antimonide is thinned in the location where one wishes to make a device using a chemical etch down to about 5000 Angstroms in thickness. This might be aided by the use of an epitaxial layer of the desired thickness at which the etching would stop. The thinned portion of the wafer is then subjected to the deposition of tantalum on both sides forming ohmic contacts with the gallium antimonide or indium antimonide. In a subsequent step, one layer of tantalum is masked while the other is subjected to an oxidation process which forms a tunnel barrier layer of tantalum oxide. In a final step, aluminum is deposited on the tantalum oxide and electrodes are applied to the various layers to apply biases thereto which will cause device 1 to switch.

Figure 2:
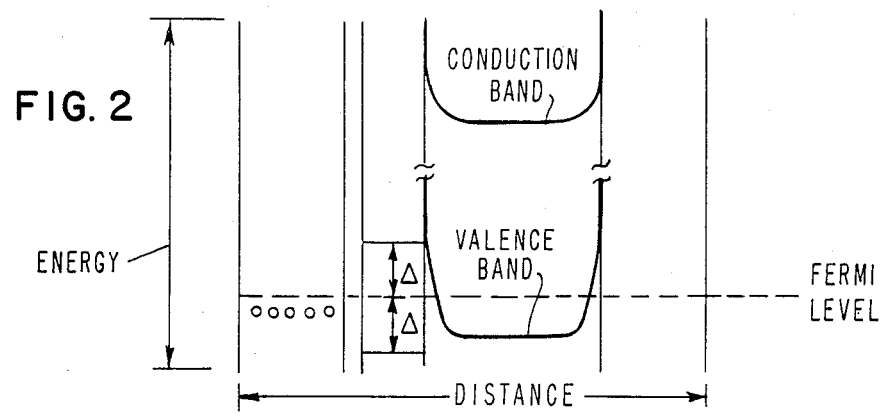
FIG. 2 shows an energy band diagram of the device of FIG. 1 utilizing a p-type semiconductor material.

Referring now to FIG. 2, there is shown an energy band diagram of the device of FIG. 1 in an unbiased state. Layer 2, which acts as the emitter of device 1, is intended to inject quasiparticles through the tunnel barrier of layer 5 into layer 3 which acts as the superconducting base. With device 1 operating well below the superconducting transition temperature of layer 3, the superconducting gap, $\Delta$, of layer 3 prevents significant current from flowing until the bias between layers 2, 3 is of the order of the superconducting gap which is the threshold level of device 1.

Figure 3:
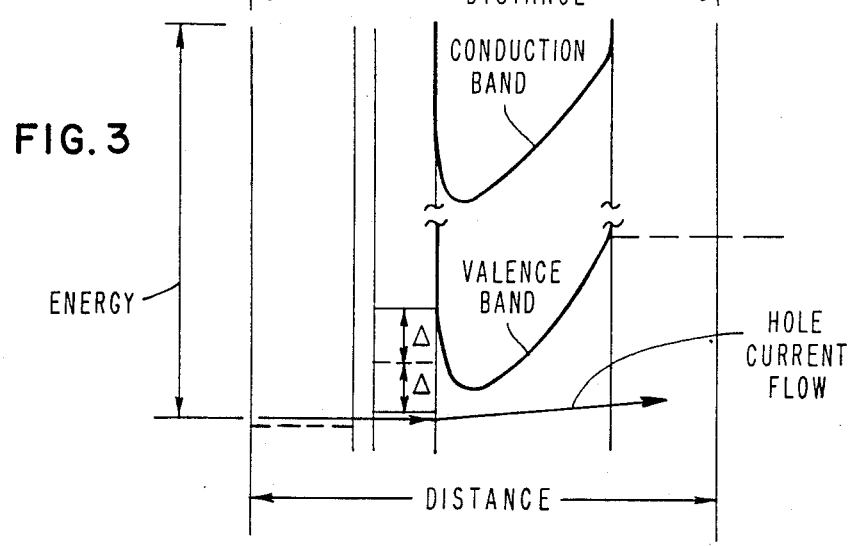
FIG. 3 shows an energy band diagram of the device of FIG. 1 under bias conditions which permit quasiparticles injected into the superconducting base layer to flow from it through the semiconductor layer to the collector layer.

Referring now to FIG. 3, the energy band diagram for device 1 in the biased condition is shown. Once a voltage of the order of the superconducting gap, $\Delta$, is applied between layers 2, 3, the quasiparticles that are injected into layer 3 from layer 2 readily pass on through superconductor layer 3 into layer 6 of semiconductor which effectively isolates collector layer 4 from base layer 3. To the extent that Cooper pairs are formed by recombination of quasiparticles injected from emitter layer 2, such Cooper pairs lie well above the valence band or well below the conduction band of semiconductor layer 6 (depending on whether the semiconductor is p or n-type) and they are of insufficient energy to exceed the energy barrier of the semiconductor material. Also, the Cooper pairs are prevented from tunnelling to collector layer 4 inasmuch as the thickness of semiconductor layer 6 is sufficiently great to prevent Cooper pair tunnelling. In this way, undesired base to collector leakage current is minimized when a bias is applied between collector and base in the absence of quasiparticle injection from emitter layer 2. Because superconducting base layer 3 is thin (its thickness is of the same order as its mean free path), injected quasiparticles readily pass on through superconducting layer 3 into semiconductor layer 6. Then, provided that the energy bands of the semiconductor are as shown in FIG. 3 (i.e., nearly, but not quite degenerate with the edge of the valence band approximately lined up with the edge of the gap of the superconductor), the application of a voltage bias between base layer 3 and collector layer 4 results in all of the carriers which enter semiconductor layer 6 being swept into collector layer 4. Thus, almost all of the current injected from emitter layer 2 arrives at collector layer 4 minus only a small amount which goes into base layer 3 due to recombination of the quasiparticles.

For the bands as shown in FIG. 3, there is essentially no threshold collector-base bias voltage and there is excellent isolation. The collector current is nearly independent of collector-base voltage from sub-millivolt biases up to the biases of the order of tens of millivolts. The maximum useful voltage depends on the band curvature at the interface between superconducting layer 5 and semiconductor layer 6 and on the width of the latter. It is important that semiconductor layer 6 be wide enough so that no direct tunnelling occurs between base layer 3 and collector layer 4 for the desired operating voltages. It is also important, for optimum operation, that semiconductor layer 6 not be too close to degenerate since this would result in excessive leakage between base layer 3 and collector layer 4. At this point, it is emphasized that the contacts between layers 3, 4 and layer 6 are either true ohmic contacts or shallow, degenerate Schottky contacts which act as ohmic contacts. This is very important for the operation of device 1 since it permits holes to move freely from base layer 3 to collector layer 4 at only meV energy levels.

The gain of device 1 is determined entirely by the recombination rate of quasiparticles as they pass through base layer 3. Thus, if a fraction, f, of the current injected from emitter layer 2 recombines to form Cooper pairs, the following relations should hold:

$$I_{base} = fI_{emitter}$$

$$I_{collector} = (1-f)I_{emitter}$$

$$\beta = \frac{I_{collector}}{I_{base}} = \frac{1-f}{f}$$

Where, for example, if f=0.05, the common emitter current gain $\beta = 19$.

Typical operating voltages for device 1 are:

Emitter to base voltage is 1 millivolt where the emitter is biased positive relative to the base.

Collector-to-base voltage is between 0–20 millivolts where the collector is negative relative to the base.

It should be appreciated that device 1 can also be made using ohmic contacts to the conduction band of an n-type semiconductor. The band diagrams for such a device, with and without biasing, would basically be mirror images of the band diagrams shown in FIGS. 2, 3 with the biases reversed from that shown in connection with FIG. 1.

The superconducting base, semiconductor-isolated device 1 described hereinabove should have excellent linearity, very wide dynamic range, high gain, low threshold and low power dissipation. In addition, the resulting devices should have high speed, excellent input/output isolation and provide high packing density in the integrated circuit environment.

While a superconductor or normal metal has been shown as the emitter electrode which injects quasiparticles through a tunnel barrier into the superconducting base, it should be appreciated that other techniques for injecting such quasiparticles may be used. For example, light of appropriate energy may be applied directly to the superconducting base to break Cooper pairs which action provides the necessary quasiparticles.

Having thus described my invention, what I claim as new, and desire to secure by Letters Patent is:

1. A superconducting transistor comprising:
   a layer of superconductive material,
   a layer of conductive material,
   means disposed between said layers for controlling the flow between said layers of quasiparticles which are generated in said layer of superconductive material and for simultaneously inhibiting the tunnelling of Cooper pairs and the flow of carriers from said layer of conductive material to said layer of superconductive material,
   said layer of superconductor material and said layer of conductive material being connected to said means for controlling and inhibiting by means of ohmic contacts.

2. A superconducting transistor according to claim 1 wherein said means for controlling and inhibiting is a layer of semiconductive material having a barrier height sufficient to permit the passage of said quasiparticles and to inhibit the flow of said carriers from said layer of conductive material to said layer of superconductive material and a thickness sufficient to inhibit tunnelling of said Cooper pairs and to minimize impact ionization.

3. A superconducting transistor according to claim 1 further including means connected to said layer of superconductive material for generating said quasiparticles in said layer of superconductive material.

4. A superconducting transistor according to claim 1 further including biasing means connected to said layers of superconductive and conductive material for initiating and halting the flow of said quasiparticles and load means connected to said layer of conductive material.

5. A superconducting transistor according to claim 1 wherein said layer of superconductive material comprises tantalum.

6. A superconducting transistor according to claim 1 wherein said layer of conductive material is a material selected from the group consisting of normal metals, superconductors and degenerate semiconductors.

7. A superconducting transistor according to claim 2 further including means connected to said layer of superconductive material for generating said quasiparticles in said layer of superconductive material.

8. A superconducting transistor according to claim 2 further including biasing means connected to said layers of superconductive and conductive material for initiating and halting the flow of said quasiparticles and load means connected to said layer of conductive material.

9. A superconducting transistor according to claim 2 wherein said layer of superconductive material comprises tantalum.

10. A superconducting transistor according to claim 2 wherein said layer of conductive material is a material selected from the group consisting of normal metals, superconductors and degenerate semiconductors.

11. A superconducting transistor according to claim 2 wherein said layer of semiconductive material comprises a semiconductor doped with a p-conductivity type dopant.

12. A superconducting transistor according to claim 2 wherein said layer of semiconductive material comprises a semiconductor doped with an n-conductivity type dopant.

13. A superconducting transistor according to claim 2 wherein said layer of semiconductive material comprises a semiconductor doped with a p-conductivity type dopant to a doping level approaching degeneracy.

14. A superconducting transistor according to claim 2 wherein said layer of semiconductive material comprises a semiconductor doped with an n-conductivity type dopant to a doping level approaching degeneracy.

15. A superconducting transistor according to claim 2 wherein said layer of semiconductive material comprises a semiconductor selected from the group consisting of gallium antimonide, indium antimonide and germanium.

16. A superconducting transistor according to claim 2 wherein said layer of semiconductive material comprises a semiconductor selected from the group consisting of gallium antimonide, indium antimonide and germanium, said semiconductor being doped with a p-conductivity type dopant to a level approaching degeneracy.

17. A superconducting transistor according to claim 3 wherein said means for generating is a source of light from which light of sufficient energy to create quasiparticles in said layer of superconductive material is applied directly to said layer of superconductive material.

18. A superconducting transistor according to claim 3 wherein said means for generating is a layer of conductive material spaced from said layer of superconductive material by a layer of insulation.

19. A superconducting transistor according to claim 6 wherein said layer of conductive material comprises tantalum and aluminum.

20. A superconducting transistor according to claim 7 wherein said means for generating is a layer of superconductive or normal metal spaced from said layer of superconductive material by a layer of insulation.

21. A superconducting transistor according to claim 7 wherein said means for generating is a source of light from which light of sufficient energy to create quasiparticles in said layer of superconductive material is applied directly to said layer of superconductive material.

22. A superconducting transistor according to claim 20 further including biasing means connected to said layers of superconductive and conductive material and said layer of superconducting or normal metal for initiating and halting the flow of said quasiparticles and load means connected to said layer of conductive material.

23. A superconducting transistor according to claim 22 wherein said layers of superconductive and conductive material are connected to said semiconductive material by means of ohmic contacts.

24. A superconducting transistor according to claim 23 wherein said layer of superconductive material comprises tantalum.

25. A superconducting transistor according to claim 23 wherein said layer of conductive material is a material selected from the group consisting of normal metals, superconductors and degenerate semiconductors.

26. A semiconducting transistor according to claim 23 wherein said layer of semiconductive material comprises a semiconductor doped with a p-conductivity type dopant.

27. A superconducting transistor according to claim 23 wherein said layer of semiconductive material comprises a semiconductor doped with an n-conductivity type dopant.

28. A superconducting transistor according to claim 23 wherein said layer of semiconductive material comprises a semiconductor doped with a p-conductivity type dopant to a doping level approaching degeneracy.

29. A superconducting transistor according to claim 23 wherein said layer of semiconductive material comprises a semiconductor doped with an n-conductivity type dopant to a doping level approaching degeneracy.

30. A superconducting transistor according to claim 23 wherein said layer of semiconductive material comprises a semiconductor selected from the group consisting of gallium antimonide, indium antimonide and germanium said semiconductor being doped with a p-conductivity type dopant to a level approaching degeneracy.

* * * * *